May 17, 1966 D. J. CARLSON 3,252,096
MULTIBAND TUNABLE CIRCUIT
Filed Dec. 4, 1962
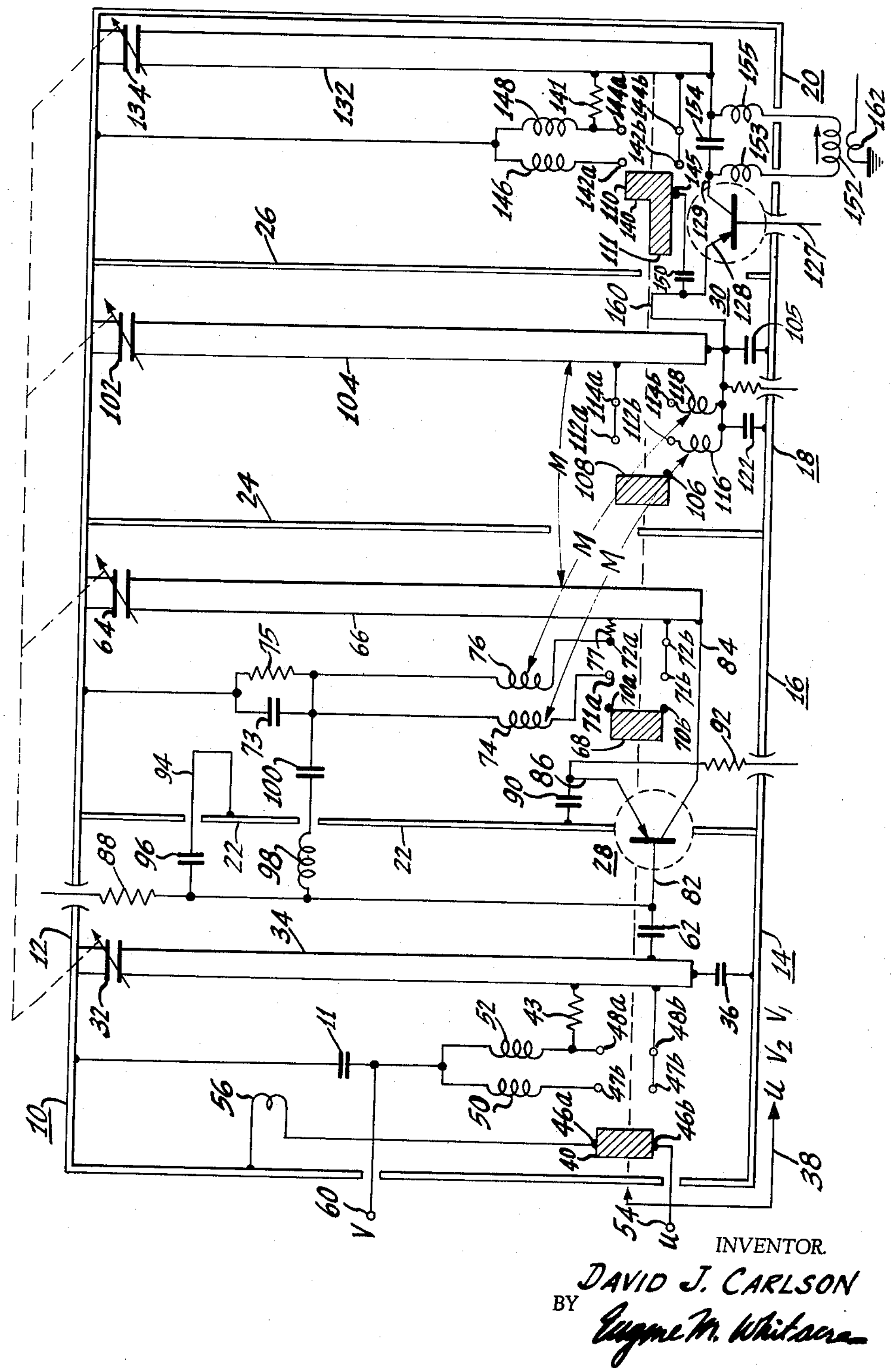
INVENTOR.
DAVID J. CARLSON
BY Eugene M. Whitacre
ATTORNEY United States Patent Office 3,252,096

Patented May 17, 1966

3,252,096

MULTIBAND TUNABLE CIRCUIT

David J. Carlson, Princeton, N.J., assignor to Radio Corporation of America, a corporation of Delaware Filed Dec. 4, 1962, Ser. No. 242,281
17 Claims. (Cl. 325—459)

This invention relates in general to tunable circuits, and more particularly to multiband tuners operable over a wide frequency range such as for example the ultra-high frequency (UHF) and the very-high frequency (VHF) television frequency bands.

The Federal Communications Commission has allocated 82 channels for the transmission of television signals in the VHF and UHF frequency bands extending roughly from 50 megacycles to 900 megacycles (mc.). In television receivers capable of receiving any one of the 82 channels, it has heretofore been the practice to provide separate UHF and VHF tuners. A tuning system including two such tuners is not only complicated and expensive in the sense that two separate chassis and mounting means must be provided therefor, but in addition, the problem of providing a simple and foolproof tuning control and indicating system is made difficult because of the electrical power and signal switching required and the fact that the two separate tuning shafts must be controlled.

Accordingly, it is an object of this invention to provide a single unit television tuner for receiving any one of the television channels in both the VHF and UHF television bands.

It is another object of this invention to provide a UHF-VHF television band tuner employing a common tuning control element.

It is still a further object of this invention to provide an all channel television tuner in which the selection of any one of the television channels in both the VHF and UHF television bands may be made with a simple and effective switching arrangement.

A multirange tuner embodying the invention employs "Q," or figure of merit, control of tuning circuit elements to establish the frequency of operation of the tuner. For example, an oscillator circuit includes an active circuit element coupled to a resonant transmission line which is tuned by a variable capacitor. An inductor and a damping resistor are also connected with the variable capacitor. At any given setting of the capacitor there are two frequencies of resonance: the first is determined by the variable capacitor in combination with the transmission line; the second is determined by the variable capacitor and the inductor. However, the resistor damps the latter circuit (reduces its Q) sufficiently so that the combination of the variable capacitor and transmission line control the frequency of oscillation.

Switching means are provided in connection with the damping resistor for changing the frequency band over which the oscillator is tunable. As mentioned above when the damping resistor is connected to lower the Q of the variable inductor, the circuit tunes over a range established by the parameters of the transmission line and variable capacitor. When the switching means is actuated, the damping resistor is shorted out or removed so that the Q of the inductor variable capacitor circuit is increased. Under these conditions the oscillator circuit is tuned over a second lower range of frequencies established by the parameters of the inductor and variable capacitor. In this regard, the active element of the oscillator circuit favors operation at the lower frequency to which the inductor and variable capacitor are tuned. If desired, a plurality of different inductors may be selectively switched into the circuit in a similar manner to effect tuning over a corresponding plurality of frequency bands.

In accordance with a feature of the invention, the signal selecting circuits of a multiband tuner may be controlled in a similar manner to effect frequency band switching.

The novel features that are considered to be characteristic of this invention are set forth with particularity in the appended claims. The invention itself, however, will be best understood from the following description when read in conjunction with the accompanying drawing, in which:

The sole figure is a diagrammatic schematic circuit diagram of a UHF-VHF television tuner embodying the invention.

The all channel television tuner shown in the drawing, includes a conductive chassis 12 which provides a shielding enclosure divided into four separate compartments 14, 16, 18 and 20 by three transverse conductive walls 22, 24 and 26. The compartments 14 and 16, respectively, comprise the tunable input and output circuits of an R.F. amplifier stage including a transistor 28, and the compartments 18 and 20 include, respectively, the tunable input circuit for the signal mixer stage and the tunable oscillator circuit. A transistor 30 included in the compartment 20 serves as the active element of the oscillator circuit, and as the mixing or frequency conversion device for the tuner.

The tunable R.F. input or signal selection circuits in the compartment 14 includes a variable tuning capacitor 32 which may, for example, comprise one portion of a parallel plate type ganged tuning capacitor having a fixed set of plates or plate of a rotatable rotor plate or plates. One of the stator and rotor plates of the capacitor 32 is mounted on and conductively connected to the chassis 12, and the other of the sets of plates is conductively connected to a transmission line conductor 34 which extends across the compartment 14 and is connected or coupled to the opposite wall of the compartment through a small tracking capacitor 36. The conductor 34 and the walls of the compartment 14 form a tunable transmission line, the function and operation of which will be described subsequently. A three-position plunger type switching means 38 is provided for selectively conditioning the all channel television tuner for tuning in: (1) the UHF or U-television band extending from 470–890 mc.; (2) the upper VHF or $V_2$ television band extending from 176–216 mc.; and (3) the lower VHF or $V_1$ television band extending from 54–88 mc.

The switching means includes a movable conductive slide member 40 and three sets of fixed contacts comprising fixed contacts *46a*–*46b*, *47a*–*47b*, *48a*–*48b*, respectively. The sets of fixed contacts are positioned for sequential engagement with the conductive slide member 40, which is of a dimension to make contact with only one of the sets of fixed contacts at a time. Two inductors 50 and 52 are respectively connected between fixed contacts *47a* and *47b* and a fixed capacitor 11. The capacitor 11 is connected to the chassis 12. The inductor 50 is selected to tune the variable capacitor 32 over the $V_2$ television band, and the inductor 52 is selected to tune the variable capacitor 32 over the $V_1$ television band.

Signals from a UHF signal source such as a UHF television antenna (not shown) are coupled to an externally available terminal 54 which is connected to the fixed contact *46b* in the compartment 14. A coupling link 56 is connected between the chassis 12 and the fixed contact *46a* so that, when the switching means 38 is set at its U position, as shown, UHF input signals are coupled from terminal 54 through the conductive slide member 40 and to the coupling link 56.

When the switching means 38 is operated to either its $V_2$ or $V_1$ position the conductive slide member 40 does not make contact with fixed contacts *46a* and *46b* whereby UHF input signals are decoupled from the coupling link 56. Signals from a VHF source, such as a VHF antenna, which have been processed in a manner such that the VHF signals are unbalanced with respect to ground, are applied between a VHF input terminal 60 and the chassis 12. The VHF input terminal 60 is connected by a conductive lead that extends through an aperture in the chassis 12, to apply VHF signals across the capacitor 11. Signal energy appearing on the transmission line conductor 34 is coupled through a coupling capacitor 62 to the input electrode of the R.F. amplifier transistor 28.

With the switching means 38 set in the U position, as shown, signal energy applied to the UHF input terminal 54 is coupled through the loop 56 to the transmission line conductor 34. To this end, it should be noted that the compartment 14 together with the transmission line conductor 34 and the tuning capacitor 32 comprises a capacitively end-loaded quarter wave transmission line with the relative dimensions and reactance values thereof being selected in accordance with known design techniques to provide tuning over the UHF television band, which extends from 470–890 mc. The coupling capacitor 62 is coupled to a point on the transmission line conductor 34 such as to provide substantially optimum coupling from the transmission line to the R.F. amplifier over the entire UHF television band. A resistor 43 connected between the inductor 52 and the transmission line conductor 34 lowers the effective Q of the inductor 52. UHF signals and VHF signals are simultaneously applied to the tuner when the switching means 38 is set at its U position. Furthermore, the circuit is simultaneously resonant at frequencies in both the U and V bands for given settings of the tuning capacitor 32. However, in the U position of the switching means 38 the resistor 43 lowers the effective Q of the inductor 52 so that the amplitude of VHF signals developed across the circuit is small enough to be neglected.

In the second or $V_2$ position of the switching means 38, the conductive slide member 40 connects the inductor 50 through the pair of fixed terminals **47*a* and 47*b* to the transmission line conductor 34, and simultaneously decouples the UHF signals from the coupling link 56. Capacitor 11, which at the frequencies in the UHF is practically a short circuit, presents a large capacitive reactance at frequencies in the $V_2$ television band permitting the coupling of VHF signals from the VHF antenna terminal 60. Although inductors 50 and 52 resonate with the tuning capacitor 32 in different frequency bands, the inductor 50 determines the frequency of resonance because of the lower effective Q of the inductor 52**. The transmission line does not affect the tuning of the input circuit because at VHF it merely acts as a conductor, and no UHF signals are applied thereto.

When the switching means 38 is set in the position corresponding to the $V_1$ television band, the conductive slide member 40 engages the fixed contacts **48*a* and 48*b* and short circuits the resistor 43 thereby raising the effective Q of the inductor 52. The inductor 50 is no longer connected in the circuit because the conductive slide member 40 is not wide enough to connect the fixed contacts 47*a* and 47*b*** to each other.

The signals in the $V_1$ and $V_2$ bands developed across the input selecting circuit are coupled through the coupling capacitor 62 to the input electrode 82 of the transistor 28.

The tunable R.F. output circuit in the compartment 16 comprises one portion of a double tuned interstage coupling network between the R.F. amplifier and mixer portions of the tuner. A variable tuning capacitor 64 which may comprise another portion of the parallel plate type ganged tuning capacitor, has one set of plates mounted on the chassis 12, with the other set of plates connected to a transmission line conductor 66 which extends across the compartment 16. The conductor 66 and the walls of the compartment 16 form another tunable transmission line.

Ganged for control by the plunger type switching means 38 is a conductive slide member 68, which is similar to the conductive slide member 40. The switch includes three sets of fixed contacts **70*a*–70*b*, 71*a*-71*b*, and 72*a*–72*b*, each corresponding to a position of the switching means 38. A first inductor 74 is connected between the fixed contact 71*a* and a parallel circuit comprising a capacitor 73 and a resistor 75, both being connected to the chassis 12. A second inductor 76 is connected between the fixed contact 72*a* and the resistor 75. A resistor 77 is connected between the inductor 76 and the transmission line conductor 66 to lower the effective Q of the inductor 76**.

The transmission line conductor 66, the compartment 16 and the tuning capacitor 64 comprise a capacitively end-loaded quarter wave transmission line which is tuned in unison with the circuit in the compartment 14.

The R.F. amplifier transistor 28 is mounted in the conductive wall 22 which separates the fixed compartments 14 and 16 in a manner such that the base electrode 82 thereof extends into the compartment 14, and the collector and emitter electrodes 84 and 86 thereof extend into the compartment 16. The base electrode 82 is coupled to the coupling capacitor 62 and receives an appropriate biasing potential from a D.C. supply circuit (not shown) connected to a resistor 88 through a feedthrough capacitor mounted in a wall of the tuner. The emitter electrode 86 is coupled through a signal bypass capacitor 90 to the conductive transverse wall 22, and is biased through a network including a resistor 92 and a feedthrough capacitor. The collector electrode 84 is directly connected to the transmission line conductor 66.

Neutralization of the R.F. amplifier is effected at UHF by a circuit including inductive loop 94 coupled to the transmission line conductor 66. One end of the loop 94 is at ground potential by connection thereof by the wall 22, and the other end of the loop 94 is connected through a neutralizing capacitor 96 to the base electrode 82. The capacitor 96 connects to the conductive loop 94 through an opening in the wall 22. For neutralization of the R.F. amplifier during operation in the $V_2$ and $V_1$ frequency bands, an inductor 98 in the compartment 14 is connected to the base electrode 82, and through an aperture in the wall 22 to a capacitor 100. The other end of the capacitor 100 is connected through the capacitor 73-resistor 75 network to ground.

The second portion of the double tuned interstage network is included in the compartment 18. A variable tuning capacitor 102 which may comprise another portion of a parallel type tuning capacitor, has one set of plates mounted on the chassis 12, with the other set of plates connected to a transmission line conductor 104 which extends across the compartment 18 and is coupled through a small tracking capacitor 105 to the opposite wall of the compartment. The conductor 104 and the walls of the compartment 18 form a third tunable transmission line.

Ganged for control by the plunger type switching means 38 is a conductive slide member 106, which is similar to conductor slide members 40 and 68. The switching means also includes two pairs of fixed contacts 112 and 114 positioned for sequential engagement with the conductive slide member 106 of the switch. A pair of inductors 116 and 118 are respectively connected between the fixed contacts **112*b* and 114*b* and a fixed capacitor 122 which is connected to the chassis 12. The other fixed contacts 112*a* and 114*a* are connected to each other and to the transmission line conductor 104. When the switching means 38 is set in the U position, the combination of transmission line conductor 104, compartment 18 and the tuning capacitor 102 comprise a capacity end-loaded quarter wave transmission line which is tuned in unison with the circuits in the compartments 14 and 16. An opening in the wall 24 permits inductive coupling between: (1) transmission line conductor 66 and transmission line conductor 104, (2) inductors 74 and 116, and (3) inductor 76 and 118**.

The compartment 20, which includes the signal mixer stage and the tunable oscillator circuit, is coupled to the compartment 18 through an opening in the wall 26. The active element of the compartment 20 is a transistor 30 mounted on the conductive wall 26 so that its emitter electrode 128 extends into the compartment 18 and its collector and base electrodes 129 and 127 extend into the compartment 20. UHF input signals are inductively coupled from the transmission line conductor 104 to the emitter electrode 128 of transistor 30 by an inductive loop 160 which is connected between emitter electrode 128 and the capacitor 122 mounted on the chassis 12. VHF input signals are directly coupled through either inductor 116 or inductor 118, depending upon the position of the switching means 38 and through the inductive loop 160, which is directly connected to inductors 116 and 118. The base elecrode 127 of transistor 30 is biased to a desired D.C. potential by an external source (not shown) connected to the base 137 through a feedthrough capacitor. A transmission line conductor 132 is connected to a variable tuning capacitor 134 which may comprise a fourth section of the ganged tuning capacitor. The conductor 132 and the walls of the compartment 20 form a fourth tunable transmission line. The transmission line conductor 132 extends across the compartment 20 in a cantilever manner and is coupled through a capacitor 154 to the collector electrode 129 of transistor 30. An I.F. coil 152 is serially connected to UHF isolating inductors 153 and 155, and a capacitor 154 is connected across this series circuit to select the intermediate frequency output signal.

Ganged for control, by the plunger type switching means 38 is a conductive slide member 140, which comprises a short wide body portion 110 and a long narrow tail portion 111. The switching means also includes two pairs of fixed contacts **142*a*–142*b* and 144*a*–144*b*. The body portion 110 of conductive slide member 140 is sufficiently wide to make contact with fixed contacts 142*a*–142*b* and 144*a*–144*b*, and it is sufficiently short that only a single set of fixed contacts is connected at a time. The tail portion 111 is long enough to connect contacts 145, 142*b* and 144*b* together in the $V_2$ and $V_1$ positions of the switching means 38. A pair of inductors 146 and 148 are connected between the fixed contacts 142*a* and 144*a* and the chassis 12, respectively. A resistor 141 is connected between inductor 148 and the transmission line conductor 132 to lower the effective Q of the inductor 148. The resistor 141 and the inductor 148 provide a direct current return path for the transistor 30. The fixed contacts 142*b* and 144*b* are connected to each other and to the transmission line conductor 132. To provide a VHF feedback path, a capacitor 150 is connected between the fixed contact 145, which corresponds to the UHF position of the switching means 38, and the emitter electrode 128 of transistor 30. Both the capacitor 150 and the emitter electrode 128 have a conductive lead extending through an opening of the wall 126**.

An inductor 162 which is inductively coupled to the inductor 152 provides the intermediate frequency output of the tuner 10.

When the switching means 38 is set in the U position, the UHF frequency of self-oscillation of the transistor 30 is determined by (1) the tuning capacitor 134, (2) the transmission line including the conductor 132 and the walls of the compartment 20, (3) the capacitor 154, and (4) the output capacitance of the transistor 30. The circuit does not oscillate at a VHF frequency because the resistor 141 lowers the Q of the circuit including the inductor 148 and insufficient energy to sustain oscillations is fed back from the VHF resonant circuit.

When the switching means 38 is set at position $V_2$, the body portion 110 of the conductor slide member 140 makes contact between the pair of fixed contacts **142*a* and 142*b* and the tail portion 111 maintains its contact with fixed contact 145, whereby the capacitor 150 is effectively coupled across the inherent capacitance of the transistor 30, and the inductor 146 is directly coupled to the transmission line conductor 132. The VHF frequency of oscillations is now determined by the inductor 146 and the variable tuning capacitor 134, even though the transmission line and the variable tuning capacitor 134 are resonant at frequencies in the UHF range. This is because the gain versus frequency characteristic of the transistor 30 is such that larger gains are obtained at lower frequencies. Hence the transistor 30 favors oscillations in the VHF range. In addition, the capacitor 150 supplements the regenerative VHF feedback voltage, and tends to damp any tendency for UHF oscillation because its reactance (between collector and emitter) is much lower at UHF frequencies than at VHF frequencies. Although the inductor 148 is also resonant with the tuning capacitor 134 at a frequency in the VHF range, the resistor 141 lowers the effective Q of the inductor 148 so that inductor 148** has little effect on the circuit.

When the switching means 38 is set at its $V_1$ position the body portion 110 of the conductor slide 140 connects the pair of fixed contacts 144 to each other short circuiting the resistor 141. The tail portion 111 of the conductive slide 140 is still in contact with the fixed contact 145 so that the capacitor 150 is still effectively connected across the inherent capacitance of the transistor 30. The frequency of self-oscillation of the transistor 30 is determined by the inductor 148 and by the tuning capacitor 134 because: (1) short circuiting the resistor 141 raises the effective Q of the inductor, and (2) the transistor 30 favors oscillations at a lower frequency because of its gain versus frequency characteristic.

Although a single active element converter stage is shown, it is to be understood that a double active element converter (one active element for the local oscillator, and the other active element for the mixer I.F. amplifier) would still be within the principles of the invention. It is also to be understood that the principles of the invention are equally applicable to an oscillator circuit rather than a converter circuit.

What is claimed is:

1. A tunable circuit comprising:

a transmission line structure including a variable capacitor for tuning over a first frequency range, a series circuit including a resistor and an inductor coupled to said variable capacitor for tuning over a second lower frequency range, said resistor lowering the effective Q of the resonant circuit including said inductor, switching circuit means having a first position for conditioning said tunable circuit to operate in said first frequency range, and a second position for short circuiting said resistor for conditioning said tunable circuit for operation in said second frequency range, and first and second input circuit means coupled to said tunable circuit for applying signals in said first and second frequency ranges, respectively.

2. A multiband tunable circuit comprising:

a transmission line and a variable capacitor for tuning over a first frequency range, switching circuit means having first and second conditions, an inductor coupled to said variable capacitor for tuning over a second lower frequency range, input circuit means for applying input signals in said first and second frequency ranges to said tunable circuit, and circuit means responsive to said switching circuit means for varying the effective Q of the resonant circuit including said inductor, whereby said tunable circuit is tuned at a frequency determined by (1) said inductor and said tuning capacitor when the resonant circuit including said inductor has a relatively large effective Q and (2) said transmission line and said tuning capacitor when the resonant circuit including said inductor has a relatively small effective Q.

3. A tunable circuit comprising:

a transmission line, a variable capacitor and first and second inductors, said variable capacitor being coupled to said transmission line to tune said transmission line at a desired frequency, switching circuit means having three positions corresponding to U, $V_2$ and $V_1$ television bands of operation, respectively, and having a conductive switch element, said conductive switch element sequentially coupling said first and second inductors to said transmission line directly when said switching means is set at said $V_2$ and $V_1$ positions respectively, switchable circuit means coupled between said transmission line and said second inductor to lower the effective Q of the resonant circuit including said second inductor, said switchable circuit means being short circuited by said conductive switch element when said switching circuit means is set in said $V_1$ position, and input circuit means for coupling VHF and UHF input signals to said tunable circuit.

4. A television tuner comprising:

a signal selecting input circuit, a tuned interstage and a converter stage, said signal selecting input circuit and each of said stages including a capacitive end-loaded transmission line and an inductor, switching circuit means, first circuit means for coupling said inductors of said signal selecting input circuit, tuned interstage and converter stage to said transmission lines of said signal selecting input circuit, tuned interstage and converter stage respectively, and second circuit means responsive to said switching circuit means for coupling directly said inductors to said transmission lines to tune said input circuit and each of said stages at a frequency determined by said inductor and said capacitive end-loaded transmission line.

5. A tuner comprising:

a signal selecting input circuit, a tuned interstage and a converter stage, said signal selecting input circuit and said stages each comprising a transmission line, a variable capacitor and an inductor, said transmission line and said inductors being tunable by said respective variable capacitors to different frequencies, input circuit means for applying input signals to said signal selecting input circuit, circuit means coupled between said transmission lines and said inductors, and switching circuit means, including switch elements for coupling said inductors directly to said transmission lines whereby, said input circuit and said stages are resonant at a frequency determined by said inductors and said variable capacitors.

6. An oscillator circuit comprising:

an active element having input and output electrodes, and having intrinsic capacitance between said input and output electrodes to provide a feedback path for energy to sustain oscillations, a transmission line tunable by a variable capacitor over a first range of frequencies, first and second inductors tunable by said variable capacitor over respective second and third ranges of frequencies, a resistor coupling said first inductor to said transmission line, and switching means including a switch element for connecting selectively said first and second inductors directly to said transmission line when said switching means is in operation whereby said oscillator's frequency is determined by said variable capacitor and by the inductor directly connected to said transmission line, said switch element being disconnected from said inductors when said switching means is not operating whereby said transmission line and said variable capacitor determines the oscillator's frequency.

7. A tunable circuit comprising:

a transmission line end-loaded by a variable capacitor for tuning over a first frequency range, an inductor adapted to be directly connected to said transmission line, said inductor when so connected being tuned by said variable capacitor over a second frequency range, damping circuit means coupled between said inductor and said transmission line to lower the effective Q of the second frequency range resonant circuit including said inductor, and switching means having a switch element short circuiting said damping circuit means to tune said tunable circuit over said second frequency range.

8. A tunable circuit comprising:

a transmission line conductor, a variable capacitor and first and second inductors, said tunable circuit being enclosed in a conductive chassis, said conductive chassis, said capacitor, and said transmission line conductor forming a quarter-wave end-loaded transmission line, switching circuit means having first, second and third operating conditions to tune said tunable circuit in the U, $V_2$ and $V_1$ television bands respectively, said switching circuit means having a set of fixed contacts which correspond to each of said operating conditions, said first and second inductors being coupled between said chassis and one of fixed contacts of each of said sets of fixed contacts corresponding to the conditions for $V_2$ and $V_1$ television bands, said switching means including a conductive switch element for sequentially connecting the terminals of each of said sets of terminals to each other respectively, a resistor connected between said transmission line and said second inductor, and input circuit means for applying UHF and VHF input signals, said UHF input circuit means being inductively coupled to said transmission line conductor only when said switching means is set at said U-band condition, said VHF input circuit means being directly coupled to said first and second inductors, respectively.

9. An oscillator circuit comprising:

an active device having input and output electrodes and having inherent capacitance between said input and output electrodes, said inherent capacitance having a value such that it provides a feedback path (1) for sufficient energy in a first frequency range to cause oscillation, and (2) insufficient energy in a second lower frequency range to cause oscillations, a circuit for determining the frequency of oscillation of said oscillator including a transmission line, an inductor and a variable tuning capacitor coupled to said active device, said inductor and said transmission line being tunable by said variable capacitor in said first and second frequency ranges, respectively, a feedback capacitor having a value such that its capacitive reactance is relatively small at frequencies in said second frequency range, and switching means including a conductive switch element for (1) coupling said feedback capacitor effectively across said intrinsic capacitance to tune said oscillator circuit at a frequency in said second frequency range determined by said variable capacitor and said inductor, and (2) decoupling said feedback capacitor from said active element to tune said oscillator circuit in said first frequency range.

10. In a UHF-VHF television tuner comprising: an R.F. amplifier being enclosed in a conductive chassis and having tuned input and output circuits and a converter stage, said converter stage including an active element having intrinsic feedback capacitance, said converter stage being enclosed in a compartment constituted by said conductive chassis and a transverse wall separating said amplifier stage and said converter stage, the combination comprising, a circuit for determining the frequency of oscillation of said converter stage including a transmission line conductor, first and second inductors, a variable tuning capacitor and a fixed feedback capacitor, said transmission line conductor forming with said compartment a section of transmission line, each of said inductors and said transmission line being tunable by said variable capacitor to different frequencies in different frequency ranges, respectively, and switching means having first, second and third positions each representing a different frequency band of operation, said switching means including a conductive switch element for (1) coupling said feedback capacitor across said intrinsic capacitance when said switching means is set at said second and third positions, (2) decoupling said feedback capacitor from said active element when said switching means is set at said first position, and (3) selectively coupling said first and second inductors to said active element when said switching means is set at said second and third positions respectively, whereby said feedback capacitor presents a low impedance path to provide enough energy to sustain oscillations at the frequencies determined by each of said inductors, said intrinsic feedback capacitance presents a low impedance path to provide enough energy to sustain oscillations at the frequency determined by said transmission line and a high impedance path to the oscillations having a frequency determined by said inductors.

11. In combination:

a circuit including a transmission line and an inductor, said transmission line and said inductor being tuned respectively by a variable capacitor at a different frequency in a different frequency range, a resistor, and switching circuit means for coupling and decoupling said resistor to said inductor to change the effective Q of the resonant circuit including said inductor, whereby the oscillation frequency of said circuit is determined by the resonant circuit having the higher Q.

12. A broad band oscillator comprising:

an amplifier device having input and output electrodes, and having intrinsic feedback capacitance between said input and output electrodes to provide a feedback path for energy to cause oscillations, said intrinsic feedback capacitance having a sufficiently small capacitive reactance value at a first frequency to sustain oscillations at said first frequency and a sufficiently large capacitive reactance value at a second frequency to prevent oscillations at said second frequency, frequency of oscillation control circuit means comprising an inductor, a resistor, a transmission line section, and a tuning capacitor connected in series with each other in the order named, circuit means for coupling said output electrode of said amplifier device to said transmission line section, a first feedback capacitor connected to said input electrode of said amplifier device, said feedback capacitor having a sufficiently small capacitive reactance value at said second frequency to sustain oscillations, and switching circuit means for selecting the frequency of oscillations, said switching circuit means including a slide conductive member to simultaneously couple said feedback capacitor to said transmission line and to short circuit said resistor, whereby said amplifier device oscillates at said second frequency.

13. A UHF-VHF converter located in a compartment formed by a conductive chassis comprising:

an amplifier device having input and output electrodes, and having intrinsic feedback capacitance between said output and input electrodes, an output circuit including an I.F. tank network, a transmission line conductor and a variable capacitor connected in series with each other in the order named between said output electrode and a point of reference potential, said transmission line conductor and said variable capacitor providing with said compartment an end-loaded quarter-wavelength transmission line, said I.F. tank network comprising a fixed capacitor and an I.F. coil, means including UHF isolating inductors for coupling said fixed capacitor across said I.F. coil.

an inductor coupled to said point of reference potential, means for selectively coupling UHF and VHF input signals to said input electrode of said amplifier device, a VHF capacitor, means for coupling and decoupling (1) said feedback capacitor between said output and input electrodes of said amplifier device and (2) said inductor between said point of reference potential and said transmission line conductor, respectively, whereby said amplifier device self-oscillates at a local frequency of oscillation determined by (1) said variable capacitor, said fixed capacitor of said I.F. tank circuit and said transmission line when said feedback capacitor is decoupled from said active element, and (2) said variable capacitor, said fixed capacitor of said I.F. tank circuit, and said inductor when said feedback capacitance is coupled between said output and input electrodes.

14. In a tuner of the type having a conductive chassis, an oscillator comprising, a circuit for determining the frequency of oscillation of said oscillator including a transmission line conductor and an inductor in a converter compartment, said transmission line conductor and the conductive chassis forming a concentric transmission line, said transmission line and said inductor being tunable by a variable capacitor to different frequency ranges, a resistor, and switching circuit means for selectively coupling and decoupling said resistor to said inductor to control the effective Q of the resonant circuit including said inductor, whereby the oscillation frequency of said oscillator is determined by the resonant circuit having the higher Q.

15. An all channel television tuner comprising:

a conductive chassis having compartments formed by conductive wall portions, a signal selecting input circuit, a tuned interstage, and a converter stage, each enclosed in a different one of said compartments, said signal selecting input circuit and said stages each comprising (1) a transmission line conductor, (2) a variable capacitor, and (3) at least one inductor, each of said transmission line conductors and its corresponding compartment providing a transmission line section, separate means for applying UHF and VHF input signals to said input circuit, circuit means coupled between each of said transmission line conductors and its corresponding inductor for lowering the effective Q of said inductors, and switching circuit means for selecting signals in different frequency bands, said switching circuit means having a first inoperative condition, and a second condition operative to couple said inductors directly to said transmission lines whereby said tuner is selectively tuned in a frequency range determined by said transmission line and said variable capacitor, and by said inductors and said variable capacitor.

16. An oscillator circuit comprising in combination:

an active circuit device having a gain-versus-frequency characteristic such as to provide higher gain in a first band of frequencies than in a second higher band of frequencies, a transmission line structure including a variable capacitor tunable over said second higher range of frequencies, an inductor coupled to said capacitor for tuning with said capacitor over said first band of frequencies, resistive damping circuit means, means connecting said transmission line structure to said active circuit element to provide regenerative feedback to sustain oscillations in one of said first and second bands of frequencies, and switching means for (1) selectively connecting said damping circuit means to damp said inductor whereby said circuit is operative to oscillate over said higher second band of frequencies and for (2) effectively decoupling said damping circuit means from said inductor whereby said circuit is operative to oscillate over said first band of frequencies because of the gain-versus-frequency characteristic of said device.

17. A television tuner comprising:

a signal selecting circuit, a tuned interstage and a converter stage, said signal selecting circuit and said stages including respectively capacitive end-loaded transmission lines and respectively inductors, switching circuit means, circuit impedance means for coupling said inductors of said signal selecting circuit, tuned interstage and converter stage to said transmission lines of said signal selecting circuit, tuned interstage and converter stage respectively, and circuit means responsive to said switching circuit means for coupling directly said inductors respectively to said transmission lines without said circuit impedance means.

References Cited by the Examiner

UNITED STATES PATENTS

| | | | |
|---|---|---|---|
| 2,772,355 | 11/1956 | Deutsch et al. | 333—82 XR |
| 3,092,775 | 6/1963 | Pitzer | 325—461 |

ROBERT H. ROSE, *Primary Examiner.*

DAVID G. REDINBAUGH, *Examiner.*

R. F. ROTELLA, R. LINN, *Assistant Examiners.*